US011145486B2

United States Patent
Inouchi

(10) Patent No.: US 11,145,486 B2
(45) Date of Patent: Oct. 12, 2021

(54) BEAM PROFILE DETERMINATION METHOD AND ION BEAM IRRADIATION APPARATUS

(71) Applicant: NISSIN ION EQUIPMENT CO., LTD., Koka (JP)

(72) Inventor: Yutaka Inouchi, Shiga (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 0 days.

(21) Appl. No.: 16/911,518

(22) Filed: Jun. 25, 2020

(65) Prior Publication Data
US 2021/0035774 A1 Feb. 4, 2021

(30) Foreign Application Priority Data
Aug. 2, 2019 (JP) .............................. JP2019-143149

(51) Int. Cl.
*H01J 37/244* (2006.01)
*H01J 37/05* (2006.01)
*H01J 37/10* (2006.01)

(52) U.S. Cl.
CPC ............ *H01J 37/244* (2013.01); *H01J 37/05* (2013.01); *H01J 37/10* (2013.01); *H01J 2237/24542* (2013.01); *H01J 2237/24585* (2013.01)

(58) Field of Classification Search
CPC .......... H01J 37/05; H01J 37/10; H01J 37/244; H01J 37/304; H01J 37/3171; H01J 37/3172; H01J 2237/245422; H01J 2237/24585
See application file for complete search history.

(56) References Cited

U.S. PATENT DOCUMENTS

| | | | | |
|---|---|---|---|---|
| 7,176,470 | B1 * | 2/2007 | Evans | H01J 37/304 250/398 |
| 7,683,347 | B2 * | 3/2010 | Gupta | H01J 37/304 250/492.21 |
| 7,772,571 | B2 * | 8/2010 | Shen | H01L 21/68764 250/492.21 |
| 2002/0081788 | A1 * | 6/2002 | Cucchetti | H01J 37/1474 438/200 |
| 2007/0170369 | A1 | 7/2007 | Purser et al. | |
| 2008/0073581 | A1 * | 3/2008 | Ikejiri | H01J 37/09 250/492.21 |
| 2008/0078953 | A1 * | 4/2008 | Gupta | H01J 37/304 250/492.21 |
| 2012/0248324 | A1 * | 10/2012 | Eisner | H01J 37/302 250/396 ML |
| 2015/0228454 | A1 * | 8/2015 | Kato | H01J 37/12 250/396 ML |

* cited by examiner

*Primary Examiner* — David E Smith
(74) *Attorney, Agent, or Firm* — Sughrue Mion, PLLC

(57) ABSTRACT

A beam profile determination method and ion implantation apparatus implanting the same is provided. The method includes measuring a beam profile of an ion beam in a direction orthogonal to a scanning direction of a substrate and a traveling direction of the ion beam; computing, based on the measured beam profile, a uniformity of a dose distribution of a part of the ion beam with which a surface of the substrate is irradiated when the substrate is scanned; and comparing the computed uniformity of the dose distribution with a first reference value to determine an adequacy of the beam profile of the ion beam.

20 Claims, 4 Drawing Sheets

Beam Profile

Average in each region

Dose Distribution

BEAM PROFILE DETERMINATION METHOD AND ION BEAM IRRADIATION APPARATUS

CROSS-REFERENCE TO RELATED APPLICATION

This application claims priority from Japanese Patent Application No. JP 2019-143149, filed Aug. 2, 2019 in the Japanese Patent Office, the entire contents of which is incorporated by reference herein in its entirety.

BACKGROUND

1. Field

The present disclosure relates to a method of determining adequacy of a beam profile of an ion beam used in ion beam irradiation treatment, and an ion beam irradiation apparatus using the method.

2. Description of Related Art

An ion beam irradiation apparatus typified by an ion implantation apparatus, an ion beam orientation apparatus or the like is configured to mechanically move a substrate across an ion beam that is longer than a dimension of the substrate in a scanning direction, thereby subjecting an entire surface of the substrate to ion beam irradiation treatment.

In the ion beam irradiation treatment using an ion beam, a beam profile in a direction orthogonal to a traveling direction of the ion beam and the scanning direction of the substrate exerts a large influence on the distribution of an ion beam irradiation amount (ion beam dose) with respect to the substrate.

For this reason, in order to provide the ion beam irradiation treatment uniformly in the surface of a substrate, in advance of the ion beam irradiation treatment for the substrate, the beam profile in the direction orthogonal to the traveling direction of the ion beam and the scanning direction of the substrate may be adjusted to become uniform.

The term "beam profile" here denotes a distribution of beam current or beam current density.

To adjust the beam profile, a multipole magnetic field or an electric field may be used.

SUMMARY

It is an aspect to shorten a time period for set-up of an ion beam irradiation apparatus, using a new beam profile determination method.

According to an aspect of one or more embodiments, there is provided a beam profile determination method comprising measuring a beam profile of an ion beam in a direction orthogonal to a scanning direction of a substrate and a traveling direction of the ion beam; computing, based on the measured beam profile, a uniformity of a dose distribution of the ion beam with which a surface of the substrate is irradiated when the substrate is scanned; and comparing the computed uniformity of the dose distribution with a first reference value to determine an adequacy of the beam profile of the ion beam.

According to another aspect of one or more embodiments, there is provided a ion beam irradiation apparatus comprising a beam profiler configured to measure a beam profile of an ion beam in a direction orthogonal to a scanning direction of a substrate and a traveling direction of the ion beam; and a control device configured to compute, based on the measured beam profile, a uniformity of a dose distribution of the ion beam with which a surface of the substrate is irradiated when the substrate is scanned; and compare the computed uniformity of the dose distribution with a first reference value to determine an adequacy of the beam profile of the ion beam.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

Figure 1:
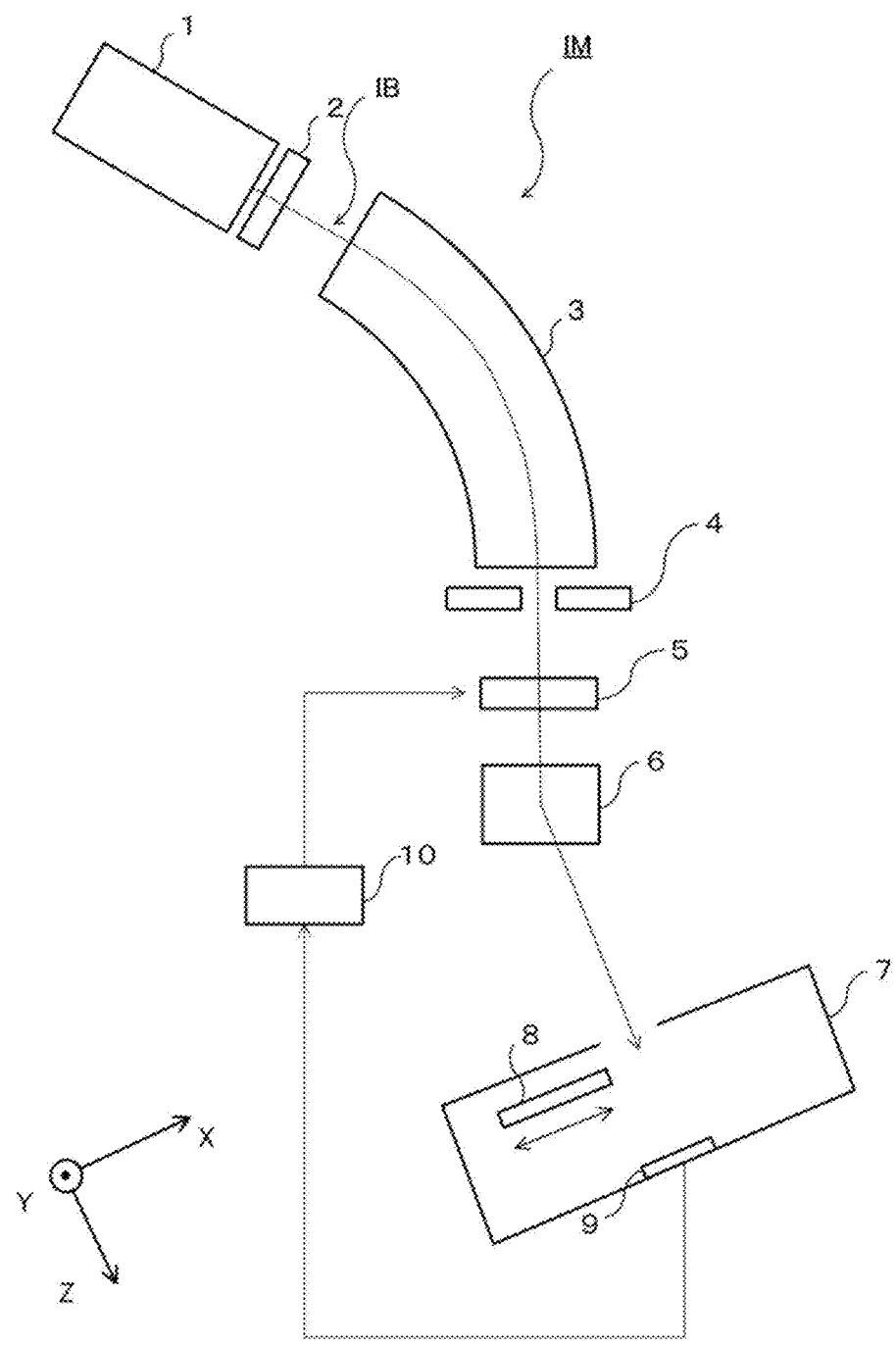
FIG. 1 is a top plan view showing a configuration of an ion implantation apparatus according to an embodiment.

As described above, to adjust the beam profile a multipole magnetic field or an electric field may be used. In the case of using an electric field, a plurality of electrodes are used. However, beam profile adjustment using a plurality of electrodes or a multipole magnetic field is complicated in terms of an adjustment operation and is time-consuming, because of an increase in the number of parameters to be used for the adjustment.

In recent years, there has been an increasing need for more accurately uniformizing the beam profile, and therefore a beam profile adjustment operation has been becoming even more time-consuming.

In a semiconductor manufacturing process, the emphasis is put on production capacity. From a viewpoint of improving the production capacity, it is also advantageous to not only stably operate an ion beam irradiation apparatus represented by an ion implantation apparatus but also to start up the ion beam irradiation apparatus in a short time.

In order to start up the manufacturing apparatus to establish a ready state for substrate treatment, several adjustment operations are required. One of the adjustment operations includes adjustment for uniformizing the beam profile. Since, as discussed above, the beam profile adjustment to make the beam more uniform has been becoming more time-consuming due to complexity of the adjustment operation. Thus, studies on how to complete this operation in a short time to shorten a time period required for start-up of the ion implantation apparatus have been made through a trial and error process.

It is an aspect of the present disclosure to shorten a time period for set-up of an ion beam irradiation apparatus, using a new beam profile determination method.

Various embodiments provide a beam profile determination method for use in an ion beam irradiation apparatus configured to move a substrate across an ion beam in a scanning direction to allow an entire surface of the substrate to be irradiated with the ion beam. The beam profile determination method includes measuring a beam profile of the ion beam in a direction orthogonal to a scanning direction of the substrate and a traveling direction of the ion beam, determining, based on a result of the measurement, a uniformity of a dose distribution of the ion beam with which the surface of the substrate is irradiated when the substrate is scanned, and comparing the uniformity of the dose distribution with a reference value to determine an adequacy of the beam profile of the ion beam.

Even in a situation where the uniformity of the beam profile of an ion beam used for substrate treatment is somewhat poor, from the perspective of the beam profile of the entire ion beam, the uniformity of the dose distribution in the surface of the substrate (substrate surface) may fall within a desired range when focusing on only the beam profile of a part of the ion beam with which the substrate is irradiated. The ion beam is not always used for the treatment of the entire surface of the substrate, or for treatment of the entire surface at a same rate. For example, when the substrate has a circular contour, a rate of the ion beam used for irradiation of the substrate surface may be different for the center and for the end of the ion beam in a longitudinal direction of the ion beam.

Further, although the uniformity of the beam profile may take the same value in a case where the beam profile is different for the center and for the end of the ion beam, and in another case where the beam profile is uneven throughout, the uniformity of the dose distribution in the substrate surface may be different for the two cases.

Considering that the ultimate goal is to uniformize the dose distribution in the substrate surface, even if the uniformity of the beam profile of the entire ion beam is somewhat poor, it should not be regarded as a problem.

From this point of view, in the present disclosure, the dose distribution in the substrate surface to be obtained when the substrate is irradiated with at least a part of the ion beam is determined, and a result of the determination is compared with a reference value to determine the adequacy of the beam profile.

The use of this determination method may eliminate a need for excessive adjustment of the beam profile, so that it becomes possible to start up the apparatus in a short time.

In the beam profile determination method according to various embodiments, when the uniformity of the dose distribution exceeds the reference value, the beam profile of the ion beam is re-adjusted.

On the other hand, for the reason that the adjustment of the beam profile is omitted as much as possible, the following method may be employed even when the uniformity of the dose distribution exceeds the reference value.

Specifically, the beam profile determination method according to various embodiments may comprise, when the uniformity of the dose distribution exceeds the reference value, determining the uniformity of the dose distribution in the surface of the substrate to be obtained when performing an operation of rotating the substrate about a normal line with respect to the surface of the substrate by a given angle, and, after the rotation by the given angle, subjecting the substrate to ion beam irradiation treatment one or more times; and comparing the uniformity of the dose distribution with a reference value.

According to this method, the ion beam irradiation treatment is performed after changing a twist angle of the substrate. Thus, as compared to a case where the twist angle is not changed at all, non-uniformity of the dose distribution may be mitigated in some cases.

Various embodiments also provide an ion beam irradiation apparatus configured to scan a substrate across an ion beam to allow an entire surface of the substrate to be irradiated with the ion beam. The ion beam irradiation apparatus may include a beam profiler and a control device. The beam profiler may measure a beam profile of the ion beam in a direction orthogonal to a scanning direction of the substrate and a traveling direction of the ion beam. The control device may determine, based on a result of the measurement in the beam profiler, a uniformity of a dose distribution of the ion beam with which the surface of the substrate is irradiated when the substrate is scanned, and compare the uniformity of the dose distribution with a reference value to determine an adequacy of the beam profile of the ion beam.

According to various embodiments, the uniformity of the dose distribution in the substrate surface to be obtained when the substrate is irradiated with at least a part of the ion beam is determined, and the result of the determination is compared with the reference value to determine the adequacy of the beam profile, so that it becomes possible to eliminate the need for excessive adjustment of the beam profile, thereby starting up the apparatus in a short time.

An ion implantation apparatus according to various embodiments will now be described with reference to the drawings. An ion implantation apparatus is known as a typical example of an ion beam irradiation apparatus for performing substrate treatment using an ion beam.

FIG. 1 is a top plan view showing an exemplary configuration of an ion implantation apparatus according to an embodiment. An ion implantation apparatus IM includes a plasma chamber 1, an extraction electrode 2, a mass analysis electromagnet 3, an analysis slit 4, a uniformizing lens 5, an electrostatic deflecting accelerator/decelerator tube 6, a treatment chamber 7, a beam profiler 9, and a control device 10. The ion implantation apparatus IM is configured to mechanically scan a substrate 8 reciprocatingly in a scanning direction indicated by the arrows in FIG. 1, with respect to an ion beam IB transported to the treatment chamber 7, thereby realizing ion implantation treatment for the entire surface of the substrate. The substrate 8 may have a circular contour, a rectangular contour, etc.

X-axis, Y-axis and Z-axis directions (X, Y and Z direction) illustrated in FIG. 1 are set with reference to the ion beam IB transported to the treatment chamber 7.

Specifically, the Z direction is a traveling direction of the ion beam IB transported to the treatment chamber 7.

The X direction is a direction parallel to a scanning direction of the substrate 8.

In some embodiments, a cross-section of the ion beam IB cut along a plane (X-Y plane) perpendicular to the Z direction has an approximately rectangular shape. The ion beam having such a cross-section is also referred to as "ribbon beam" or "sheet beam".

In the cross-section of the ion beam IB, a Y-directional dimension of the ion beam orthogonal to the X and Z directions is greater than an X-directional dimension thereof. Thus, in this specification, the Y direction is referred to as "longitudinal direction" of the ion beam IB.

The dimension of the ion beam IB in the Y direction is greater than the dimension of the substrate 8 in the Y direction, so that ion beam irradiation treatment for the entire surface of the substrate may be realized by allowing the substrate 8 to be scanned across the ion beam IB.

The plasma chamber 1 is a chamber in which plasma is generated. The extraction electrode 2 extracts an ion beam IM from the plasma chamber 1. The mass analysis electromagnet 3 deflects an unnecessary ion species and a desired ion species contained in the extracted ion beam IB, respectively, at different turning radiuses. The analysis slit 4 hinders traveling of the unnecessary ion species separated by the mass analysis electromagnet 3, toward a downstream side. The uniformizing lens 5 is used in adjustment of the beam profile in the longitudinal direction (Y direction) of the desired ion species-containing ion beam passing through the analysis slit 4. The electrostatic deflecting accelerator/decelerator tube 6 accelerates or decelerates the desired ion species-containing ion beam passing through the uniformizing lens 5 to have a given energy, and removes undesired energy components arising during the acceleration/deceleration.

The treatment chamber 7 includes the beam profiler 9. The beam profiler 9 is disposed to measure the beam profile of the ion beam IB in the longitudinal direction (this beam profile will hereinafter be referred to as "the beam profile", unless otherwise noted).

In some embodiments, the beam profiler 9 includes a multipoint Faraday cup assembly comprising a plurality of Faraday cups arranged in the Y direction. In other embodiments, the beam profiler 9 includes a movable Faraday cup assembly configured to measure the beam profile while moving one or more Faraday cups in the Y direction.

In some embodiments, the control device may include a microprocessor and associated memory that stores computer code which when executed by the microprocessor controls the ion implantation apparatus IM and its associated components. Alternatively, in other embodiments, the control device may include hardware circuitry including hardware logic in communication with at least the beam profiler 9 and the uniformizing lens 5 (see below) to perform the beam measurement method according to various embodiment described further below.

A result of the measurement in the beam profiler 9 is transmitted to the control device 10. The control device 10 is configured to transmit, based on the received measurement result, an instruction signal to the uniformizing lens 5 to adjust the beam profile. The uniformizing lens 5 includes, for example, a multipolar magnetic field lens element. In some embodiments, the multipolar magnetic field lens element may be a multipolar magnetic field lens element disclosed in JP 2013-93327A.

Figure 2A:
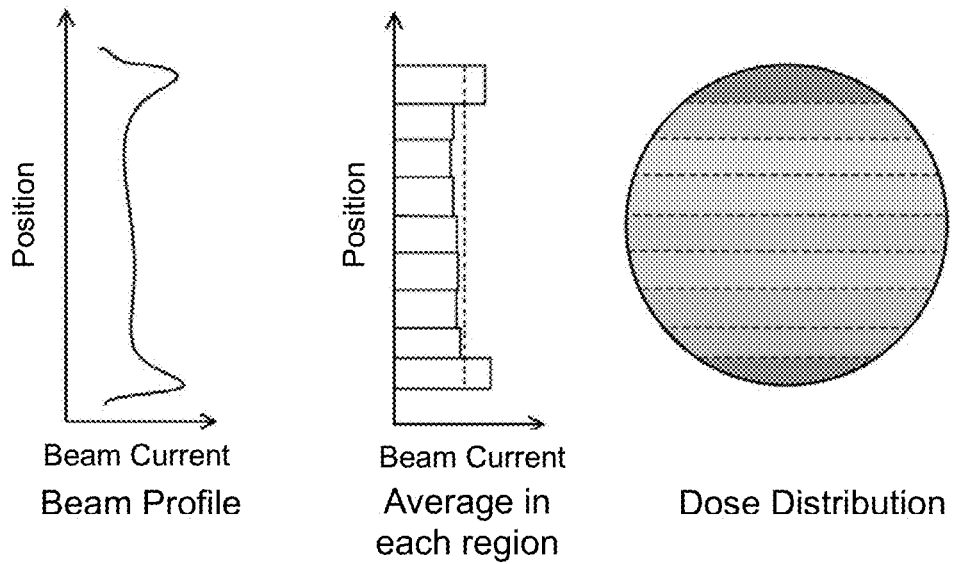
FIGS. 2A and 2B are explanatory diagrams of a beam profile and a dose distribution, according to an embodiment.
Figure 2B:
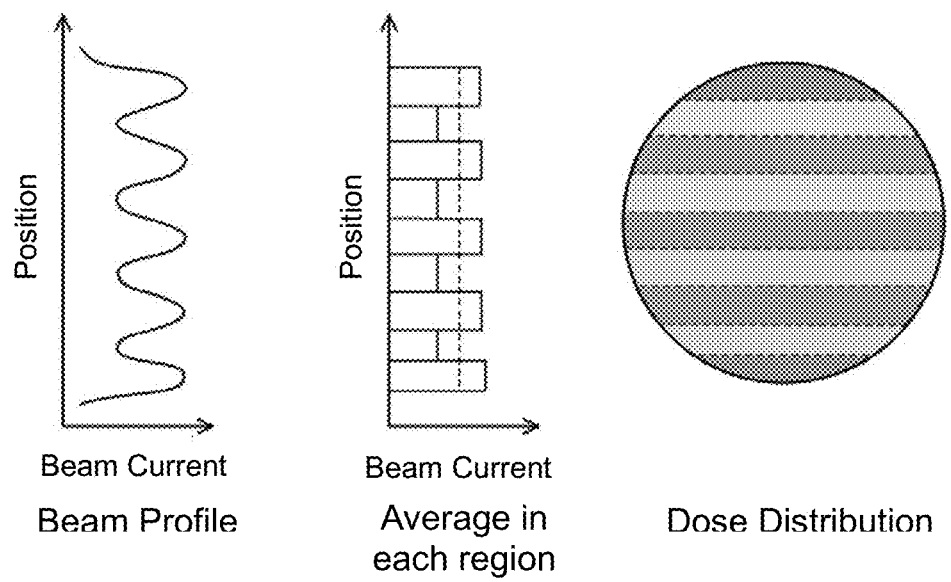

FIGS. 2A and 2B are explanatory diagrams of a beam profile and a dose distribution, according to various embodiments.

The ion beams in FIGS. 2A and 2B are different in terms of the beam profile depicted on the left side of each figure, but approximately identical in terms of an average value obtained by averaging the entire beam profile, i.e., an uniformity value, depicted by the dotted line in the middle of each figure. In other words, the uniformity value of the beam profile may be obtained by averaging the beam current over the entire beam profile.

A dose distribution obtained when a substrate is scanned in the right-left direction with respect to each of the two ion beams in each figure is depicted on the right side of each figure. In other words, the right side of each figure illustrates the dose received by different portions of the substrate when viewed from a top looking down on the substrate. The lightness/darkness of the substrate surface corresponds to the dose of each of the ion beams, wherein a darker color denotes a larger dose of the ion beam.

Here, it is assumed that a scanning speed of the substrate is constant for the sake of simplifying the description, and thus, in the dose distribution in the substrate surface, there is no change in the dose in the right-left direction of each figure.

In the dose distribution depicted on the right side of FIG. 2A, although there are two slightly darker areas at an upper and a lower end thereof, the rate of these areas in the entire substrate surface is small, and the substrate surface has a same level of lightness/darkness as a whole. Thus, with regard to the dose distribution, a certain level of uniformity may be deemed to be achieved.

On the other hand, in the dose distribution depicted on the right side of FIG. 2B, a striped light and dark pattern appears in an up-down direction. Thus, as is evident from a comparison with the dose distribution of FIG. 2A, this dose distribution may be deemed to be non-uniform. In other words, the dose distribution may not be deemed to be uniform.

As above, even though two ion beams are approximately identical in terms of the uniformity of the beam profile (i.e., the dotted line in the middle of each figure), the ion beams may be largely different in terms of the uniformity of the dose distribution.

Considering that the ultimate goal is to provide uniformity in the dose distribution in the substrate surface, even if the uniformity of the beam profile is somewhat poor, it should not be regarded as a problem, and any adjustment for excessively improving the uniformity of the beam profile is not necessary, as long as the ultimate goal may be achieved.

From this point of view, in various embodiments, the necessity of beam profile adjustment is determined while taking into account the dose distribution in the substrate surface as the ultimate goal, so that it is possible to avoid excessive adjustment of the uniformity of the beam profile, thereby shortening a time period for the start-up of the ion implantation apparatus.

The uniformity of the dose distribution mentioned here is not a value computed based on an average beam current density obtained by simply averaging data about a beam profile measured by the beam profiler.

In various embodiments, the uniformity of the dose distribution is obtained by projecting an ion beam onto a plurality of areas of the substrate surface, and averaging beam current density values in a plurality of projected ion beam segments each corresponding to a respective one of the areas of the substrate surface. A specific example of this computational method will be described below.

First, the substrate surface to be irradiated with the ion beam is segmented into a plurality of striped areas as depicted on the right side of FIGS. 2A and 2B. In the segmentation, the striped pattern is merely one example. Embodiments are not limited thereto, and in other embodiments, the substrate surface may be segmented in any other suitable pattern, such as a grid pattern.

Subsequently, beam current density values of a plurality of ion beam segments with each of which a respective one of the striped areas is irradiated are computed based on a result of measurement of the beam profile of the ion beam, and an average of the computed beam current density values is computed. A standard deviation is computed based on the average and the beam current density values corresponding to the respective areas, to obtain the uniformity of the dose distribution.

The scanning speed of the substrate and the number of times of the scanning movement of the substrate across the ion beam during the ion implantation treatment may be set based on the average beam current density in the entire irradiation region of the substrate surface.

Figure 3:
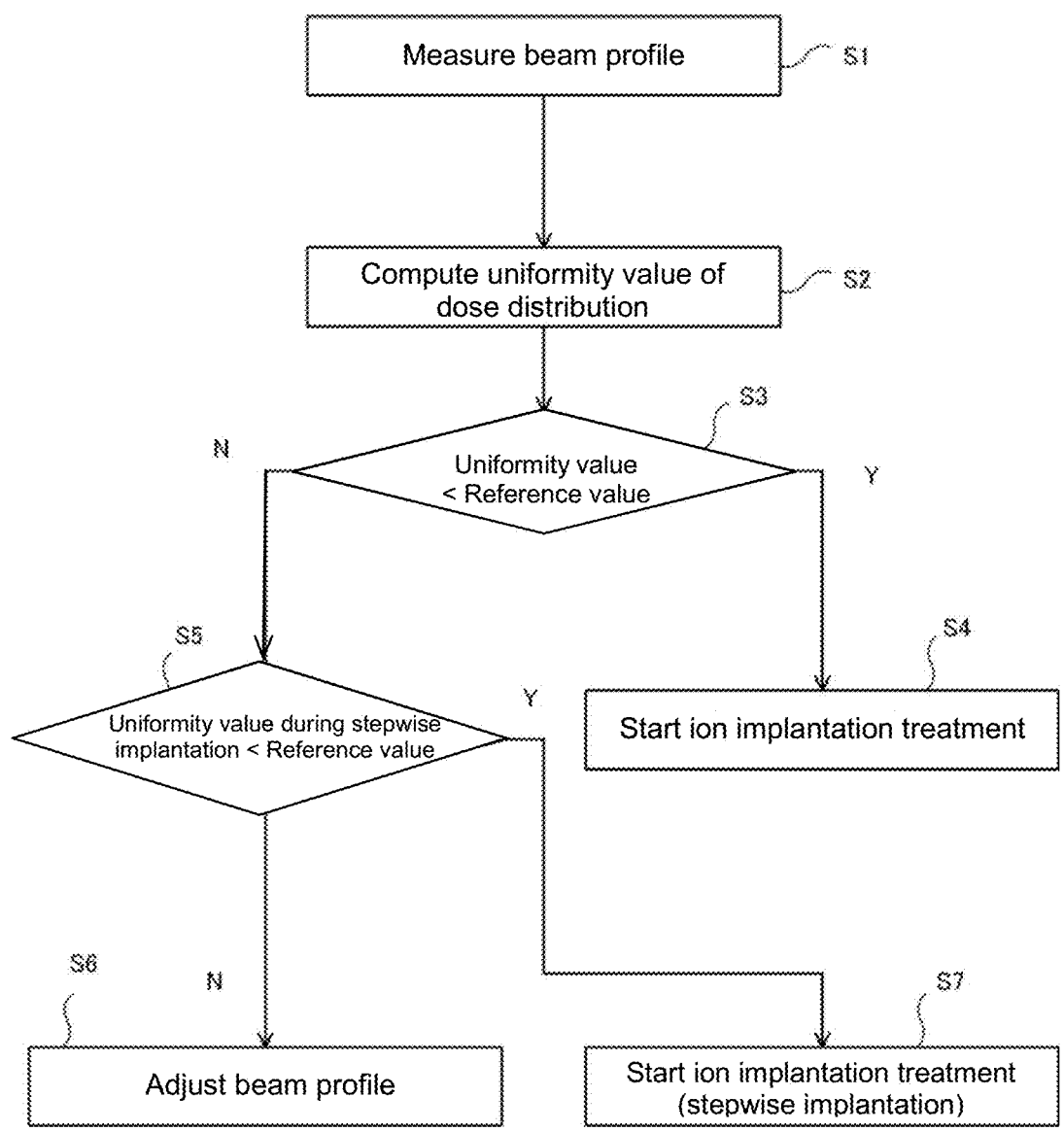
FIG. 3 is a flowchart of a beam profile determination process, according to an embodiment.

FIG. 3 is a flowchart of a beam profile determination process, according to an embodiment. Based on the flowchart of FIG. 3, a specific process will be described below.

First, the beam profile is measured by the beam profiler 9 (S1). Then, a uniformity value of the dose distribution in the substrate surface is computed based on the measured beam profile (S2). For example, the uniformity value of the dose distribution may be computed by segmenting the substrate surface to be irradiated with the ion beam into a plurality of striped areas as depicted on the right side of FIGS. 2A and 2B, and subsequently, computing beam current density values of a plurality of ion beam segments with each of which a respective one of the striped areas is irradiated based on a result of measurement of the beam profile of the ion beam, computing an average of the computed beam current density values, and computing a standard deviation based on the average and the beam current density values corresponding to the respective areas, to obtain the uniformity of the dose distribution. The computed uniformity value is compared with a reference value (S3). The reference value may be pre-set. As a result, when the computed uniformity value is less than the reference value (S3, Y), the uniformity of the dose distribution in the substrate surface is determined to be good, and the ion plantation treatment is started without adjusting the current beam profile (S4). In other words, in this specification, a lower uniformity value denotes a better uniformity.

On the other hand, when the computed uniformity value is equal to or greater than the reference value (S3, N), the current beam profile is determined to be poor, and beam profile adjustment may be performed.

Alternatively, in some embodiments, before adjusting the current beam profile, stepwise implantation may be performed to improve the uniformity of the dose distribution.

The stepwise implantation denotes a technique of, in the process of the ion implantation treatment, changing the twist angle of the substrate at a position where the substrate is not irradiated with the ion beam, and then restarting the ion implantation treatment.

An operation of changing the twist angle and then performing the ion implantation treatment is repeatedly conducted a given number of times. Giving a specific example, in a case where the ion implantation treatment is performed one after another every time the substrate is rotated stepwisely by 90° until reaching 360°, the stepwise implantation is performed four times. Here, a rotational axis about which the substrate is rotated during the stepwise rotation is in parallel relation to a normal line with respect to the substrate surface, so that the substrate is rotated about the center of the substrate.

As a result of the stepwise implantation, the twist angle of the substrate to be scanned with respect to the ion beam is changed, and thereby the irradiation region is re-irradiated and subjected to averaging, so that the uniformity of the dose distribution in the substrate surface may be improved to a certain degree.

In the case of using the stepwise implantation, for example, a step of computationally obtaining the uniformity value of the dose distribution, and comparing the computed uniformity value with a reference value (S5) may be provided after the step S3, as shown in the flowchart of FIG. 3. It should be noted here that the step S5 is not essential and in some embodiments may be omitted. Specifically, when the uniformity of the dose distribution is equal to or greater than the reference value (S3, N), readjustment of the beam profile (S6) may be performed after the step S3 without performing operation S5.

Returning to FIG. 3, the uniformity value of the dose distribution during the stepwise implantation is compared with a reference value (S5), and, when the uniformity is determined to be less than the reference value (S5, Y), the ion implantation treatment is started using the step implantation (S7). It is noted that the reference value in S5 may be the same the reference value in S3. Alternatively, the reference value in S5 may be different than the reference value in S3. Otherwise, when the uniformity value is determined to be equal to or greater than the reference value (S5, N), the current beam profile is adjusted (S6).

In the above process, the beam profile adjustment step is executed only if the beam profile is ultimately determined to be inadequate based on the uniformity of the dose distribution, so that it is possible to omit excessive beam profile adjustment as much as possible.

The configuration of the ion implantation apparatus IM depicted in FIG. 1 is merely one example. In other embodiments, an ion implantation apparatus may comprise at least the beam profiler 9 and the uniformizing lens 5.

The above embodiments have been described based on an example of an ion implantation apparatus IM. However, in other embodiments, the beam profile determination method may be applied to an ion beam irradiation apparatus for subjecting a substrate to ion beam irradiation treatment using an ion beam, wherein the apparatus adjusts a beam profile.

Further, in addition to the ion implantation apparatus, in other embodiments, the technique using the stepwise implantation may also be applied to any other type of ion beam irradiation apparatus.

The above embodiments have been described based on an example where the substrate used has a circular contour. However, the shape of the substrate is not particularly limited, and may be any other shape, such as a rectangular shape.

In the above embodiments, when the current beam profile is determined to be poor, the beam profile adjustment is performed. In this case, it is not necessary to adjust the beam profile of the entire ion beam. In many cases, the substrate treatment requires only a partial region of an ion beam with which a substrate is irradiated, so that only such a partial region of the ion beam required for the substrate treatment may be subjected to the beam profile adjustment.

Figure 4:
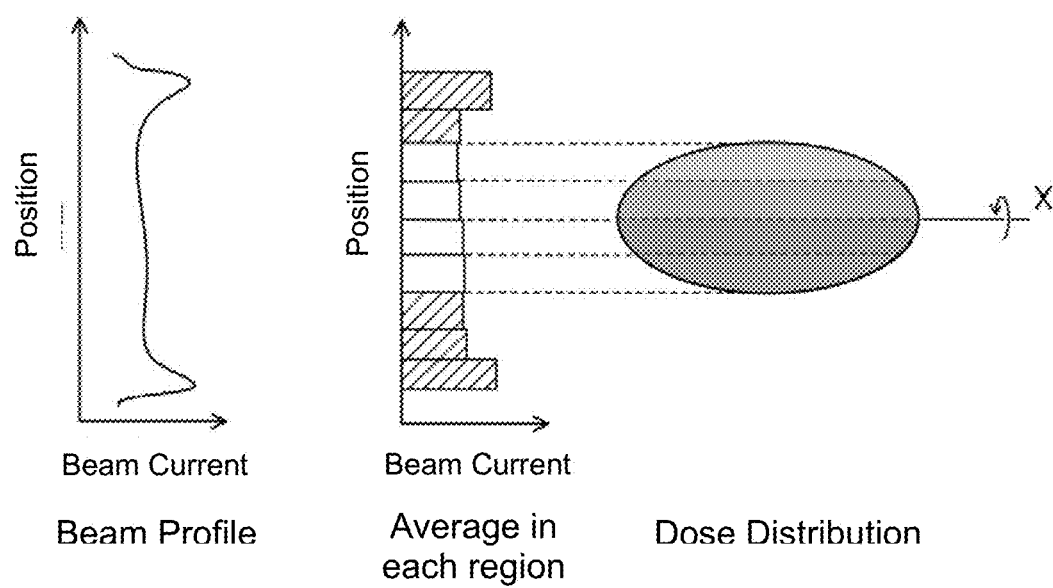
FIG. 4 is an explanatory diagram of a beam profile and a dose distribution in a case where a tilt angle is adjusted, according to an embodiment.

For example, in a case where a circular-shaped substrate is rotated about the X axis to set the tilt angle, as shown in FIG. 4, hatched areas of an ion beam in the graph indicating an average beam current in each area, depicted in the middle of FIG. 4, are a region with which the substrate is not irradiated. Thus, the region corresponding to the hatched areas needs not necessarily be subjected to the beam profile adjustment.

Further, in a case where a substrate having a size less than that of a commonly used substrate is handled, a situation where a partial region of an ion beam with which the substrate is irradiated becomes a large part of the entire ion beam is likely to arise, as with the aforementioned situation where the tilt angle is set.

In such a situation, the beam profile adjustment for a region with which the substrate is not irradiated may be omitted to reduce the number of parameters for use in the beam profile adjustment, as with the situation where the tilt angle is set.

In the above embodiments, as shown in FIGS. 2A, 2B and 4, in the process of obtaining the uniformity value of the dose distribution, the substrate surface is segmented in a striped pattern. In the case of performing the stepwise implantation, the substrate surface will be segmented in a more complicated pattern.

It should be understood that the present disclosure is not limited to the above described embodiments, but various changes and modifications may be made therein without departing from the spirit and scope thereof as set forth in appended claims.

What is claimed is:

1. A beam profile determination method comprising:
measuring a beam profile of an ion beam in a direction orthogonal to a scanning direction of a substrate and a traveling direction of the ion beam;
computing, based on the measured beam profile, a uniformity of a dose distribution of the ion beam with which a surface of the substrate is irradiated when the substrate is scanned by projecting the ion beam onto a plurality of areas of the surface and averaging beam current density values in a plurality of projected ion beam segments each corresponding to a respective one of the plurality of areas; and
comparing the computed uniformity of the dose distribution with a first reference value to determine an adequacy of the beam profile of the ion beam.

2. The beam profile determination method as recited in claim 1, further comprising, when the computed uniformity of the dose distribution is greater than or equal to the first reference value, adjusting the beam profile of the ion beam.

3. The beam profile determination method as recited in claim 2, further comprising, when the computed uniformity of the dose distribution is less than the first reference value, starting ion implantation using the measured beam profile.

4. The beam profile determination method as recited in claim 1, further comprising, when the computed uniformity of the dose distribution is less than the first reference value, starting ion implantation using the measured beam profile.

5. The beam profile determination method as recited in claim 1, further comprising, when the uniformity of the dose distribution is greater than or equal to the first reference value,
computing the uniformity of the dose distribution in the surface of the substrate when performing, one or more times, an operation of rotating the substrate by a given angle about a normal line with respect to the surface of the substrate, and, after the rotation by the given angle, subjecting the substrate to an ion beam irradiation treatment; and
comparing the computed uniformity of the dose distribution with a second reference value.

6. The beam profile determination method as recited in claim 5, further comprising, when the computed uniformity of the dose distribution is less than the first reference value, starting ion implantation using the measured beam profile.

7. The beam profile determination method as recited in claim 6, wherein, when the computed uniformity of the dose distribution is equal to or greater than the second reference value adjusting the beam profile.

8. The beam profile determination method as recited in claim 7, wherein, when the computed uniformity of the dose distribution is less than the second reference value, starting stepwise implantation of the substrate.

9. The beam profile determination method as recited in claim 1, wherein the uniformity of the dose distribution that is computed is only of a portion of the ion beam which irradiates the surface of the substrate.

10. An ion beam irradiation apparatus comprising:
a beam profiler configured to measure a beam profile of an ion beam in a direction orthogonal to a scanning direction of a substrate and a traveling direction of the ion beam; and
a control device configured to:
compute, based on the measured beam profile, a uniformity of a dose distribution of the ion beam with which a surface of the substrate is irradiated when the substrate is scanned by projecting the ion beam onto a plurality of areas of the surface and averaging beam current density values in a plurality of projected ion beam segments each corresponding to a respective one of the plurality of areas; and
compare the computed uniformity of the dose distribution with a first reference value to determine an adequacy of the beam profile of the ion beam.

11. The ion beam irradiation apparatus as recited in claim 10, wherein the control device is further configured to, when the computed uniformity of the dose distribution is greater than or equal to the first reference value, adjust the beam profile of the ion beam.

12. The ion beam irradiation apparatus as recited in claim 11, wherein the control device is further configured to, when the computed uniformity of the dose distribution is less than the first reference value, starting ion implantation using the measured beam profile.

13. The ion beam irradiation apparatus as recited in claim 10, wherein the control device is further configured to, when the computed uniformity of the dose distribution is less than the first reference value, start ion implantation using the measured beam profile.

14. The ion beam irradiation apparatus as recited in claim 10, wherein the control device is further configured to, when the uniformity of the dose distribution is greater than or equal to the first reference value,
compute the uniformity of the dose distribution in the surface of the substrate when performing, one or more times, an operation of rotating the substrate by a given angle about a normal line with respect to the surface of the substrate, and, after the rotation by the given angle, subjecting the substrate to an ion beam irradiation treatment; and
compare the computed uniformity of the dose distribution with a second reference value.

15. The ion beam irradiation apparatus as recited in claim 14, wherein the control device is further configured to, when the computed uniformity of the dose distribution is less than the first reference value, start ion implantation using the measured beam profile.

16. The ion beam irradiation apparatus as recited in claim 15, wherein the control device is further configured to, when the computed uniformity of the dose distribution is equal to or greater than the second reference value, adjust the beam profile.

17. The ion beam irradiation apparatus as recited in claim 16, wherein the control device is further configured to, when the computed uniformity of the dose distribution is less than the second reference value, start stepwise implantation of the substrate.

18. The ion beam irradiation apparatus as recited in claim 10, further comprising:
a plasma chamber in which a plasma is generated;
an extraction electrode that extracts the ion beam from the plasma chamber;
a mass analysis electromagnet that deflects an unnecessary ion species and a desired ion species contained in the extracted ion beam, respectively, at different turning radiuses;

an analysis slit that limits travelling of the unnecessary ion species toward a downstream side of the analysis slit;

a uniformizing lens that adjusts the beam profile; and a treatment chamber.

19. The ion beam irradiation apparatus as recited in claim 18, wherein the treatment chamber includes the beam profiler and is configured to accommodate the substrate.

20. A beam profile determination method comprising:

measuring a beam profile of an ion beam in a direction orthogonal to a scanning direction of a substrate and a traveling direction of the ion beam;

computing, based on the measured beam profile, a uniformity of a dose distribution in a surface of the substrate by projecting the ion beam onto a plurality of areas of the surface and averaging beam current density values in a plurality of projected ion beam segments each corresponding to a respective one of the plurality of areas; and comparing the computed uniformity of the dose distribution with a first reference value to determine an adequacy of the beam profile of the ion beam.

\* \* \* \* \*